US006594795B1

(12) United States Patent
Satou

(10) Patent No.: US 6,594,795 B1
(45) Date of Patent: Jul. 15, 2003

(54) VITERBI DECODER USING A REVERSE TRELLIS DIAGRAM

(75) Inventor: Takashi Satou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/537,781

(22) Filed: Mar. 29, 2000

(30) Foreign Application Priority Data

Jul. 15, 1999 (JP) .......................................... 11-202272

(51) Int. Cl.[7] .......................... H03M 13/00; H04L 25/02
(52) U.S. Cl. .......................... 714/795; 375/262; 375/341
(58) Field of Search ................................ 714/795, 796, 714/786; 375/262, 341

(56) References Cited

U.S. PATENT DOCUMENTS

| | | | | |
|---|---|---|---|---|
| 5,339,824 A | * | 8/1994 | Engira | 600/525 |
| 5,710,784 A | * | 1/1998 | Kindred et al. | 714/795 |
| 5,757,282 A | * | 5/1998 | Lotter | 340/870.05 |
| 5,802,115 A | | 9/1998 | Meyer | |
| 5,923,713 A | * | 7/1999 | Hatakeyama | 375/341 |
| 5,933,462 A | * | 8/1999 | Viterbi et al. | 375/341 |
| 6,058,146 A | * | 5/2000 | Yoshida | 375/341 |
| 6,199,190 B1 | * | 3/2001 | Wan | 714/786 |
| 6,272,187 B1 | * | 8/2001 | Rick | 375/341 |

FOREIGN PATENT DOCUMENTS

| | | |
|---|---|---|
| JP | 59-51645 | 3/1984 |
| JP | 1-291525 | 11/1989 |
| JP | 7-147594 | 6/1995 |
| JP | 8-214299 | 8/1996 |

* cited by examiner

*Primary Examiner*—Albert Decady
*Assistant Examiner*—Esaw Abraham
(74) *Attorney, Agent, or Firm*—Katten Muchin Zavis Rosenman

(57) ABSTRACT

There is provided a Viterbi decoder which performs an ACS operation in the same order of time-series as branch metrics were computed in a decoding process, and restores transmission information as an array of survivors. There is also provided a transmitting equipment which transmits, to a receiving equipment incorporating the above Viterbi decoder, a transmission sequence that includes a bit sequence obtained by splitting transmission information into pieces having a prescribed word length and reversing the order on the time series after being subjected to coding that conforms to the Viterbi decoder. In a transmission system using such a Viterbi decoder and transmitting equipment, the flexibility relating to the standardization, designing, maintenance, and operation of equipment is increased and reduction in running cost and increase in reliability can be attained without deteriorating the performance or service quality.

9 Claims, 12 Drawing Sheets

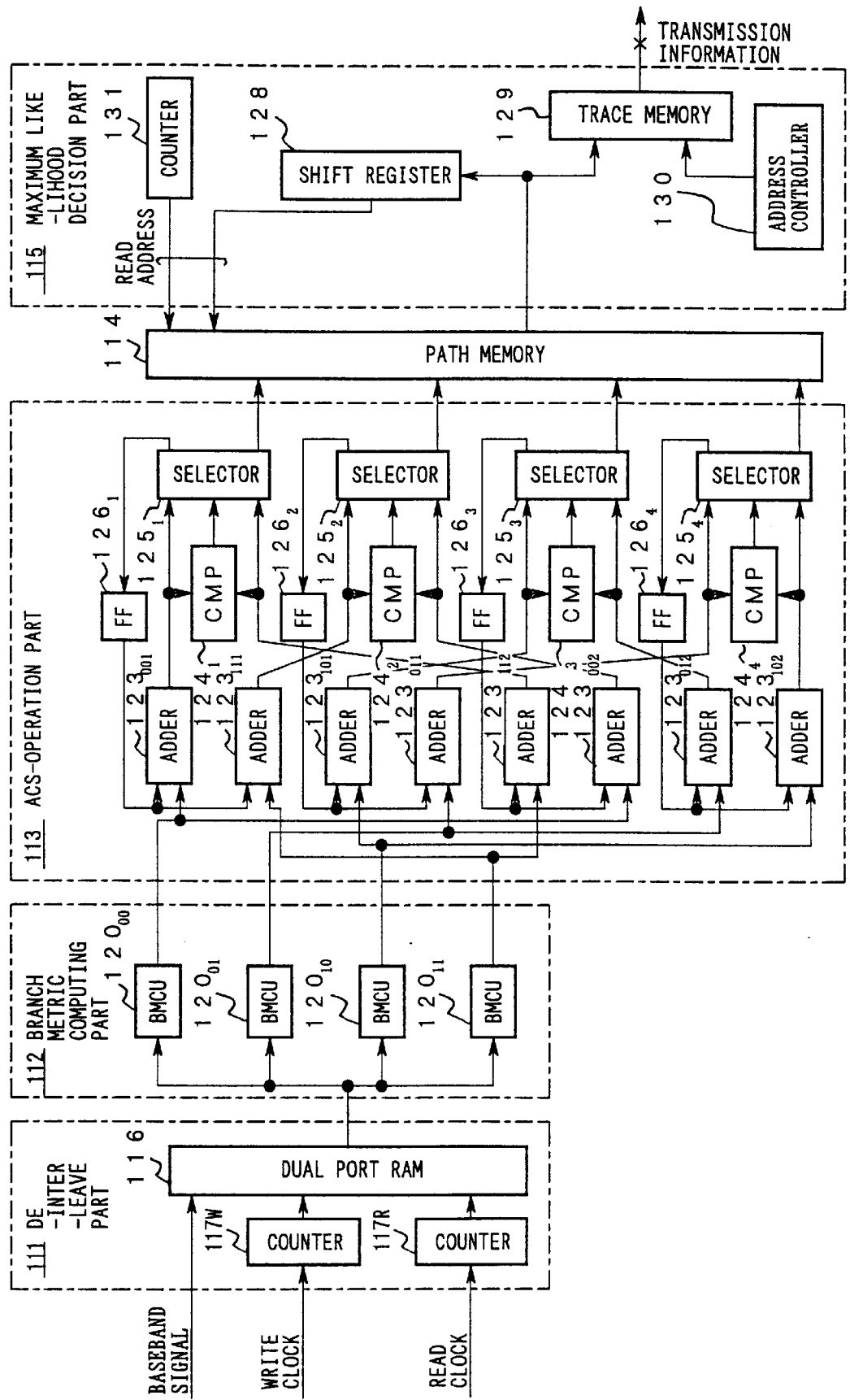

PRIOR ART  FIG. 9
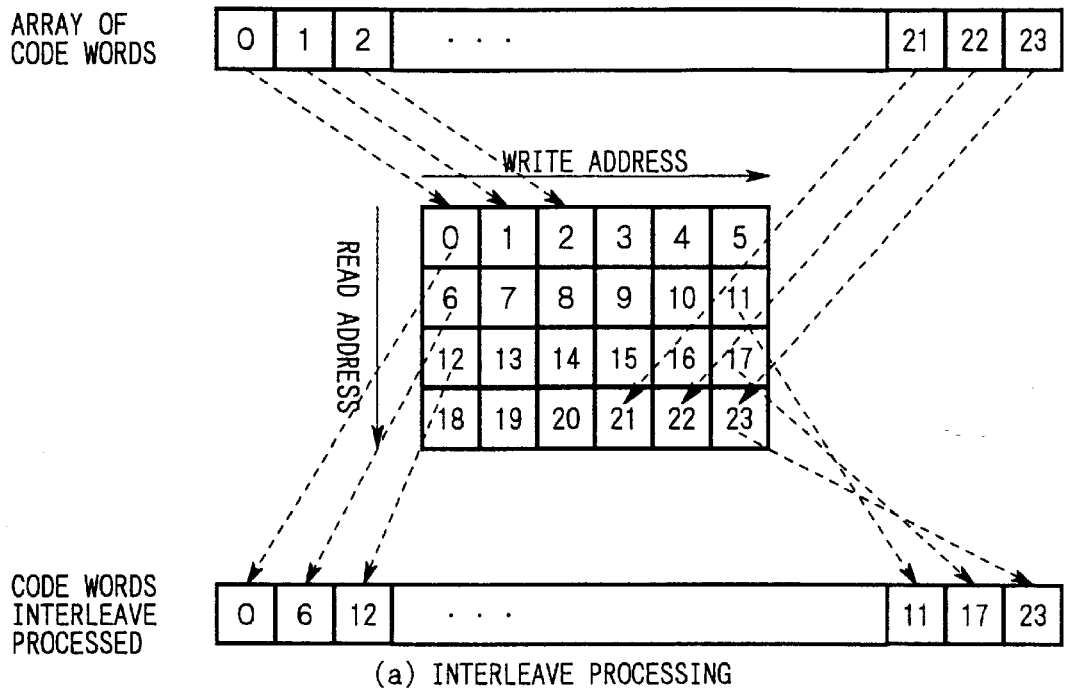
(a) INTERLEAVE PROCESSING
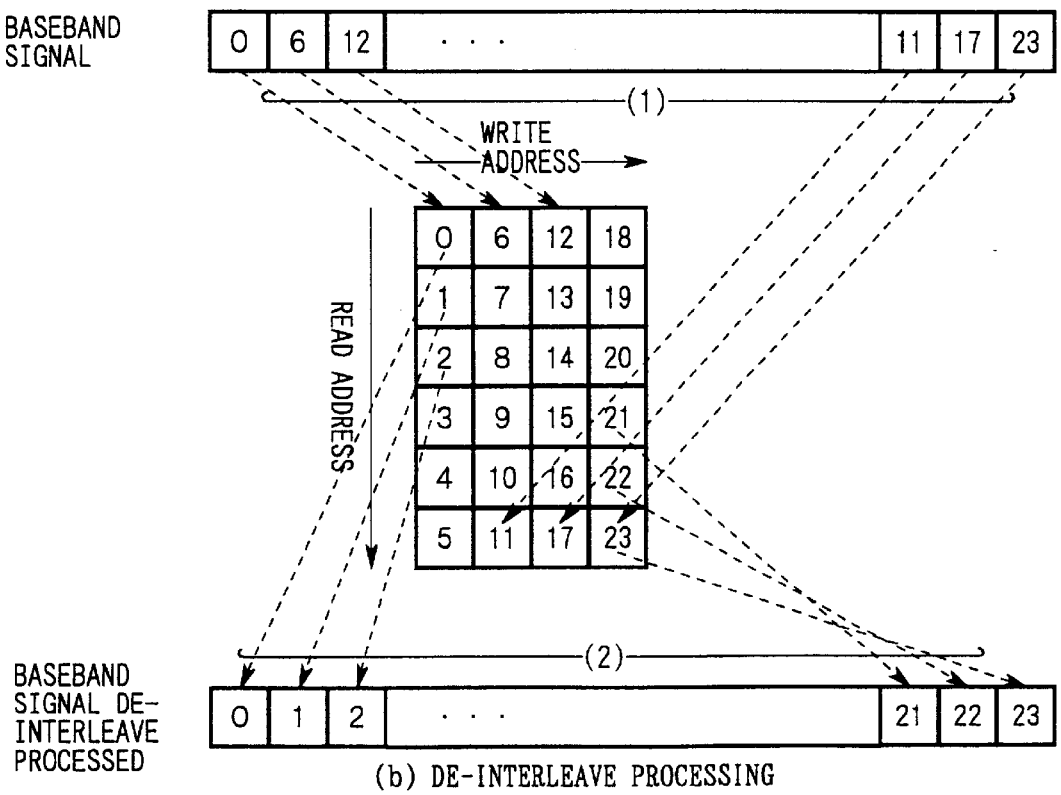
(b) DE-INTERLEAVE PROCESSING

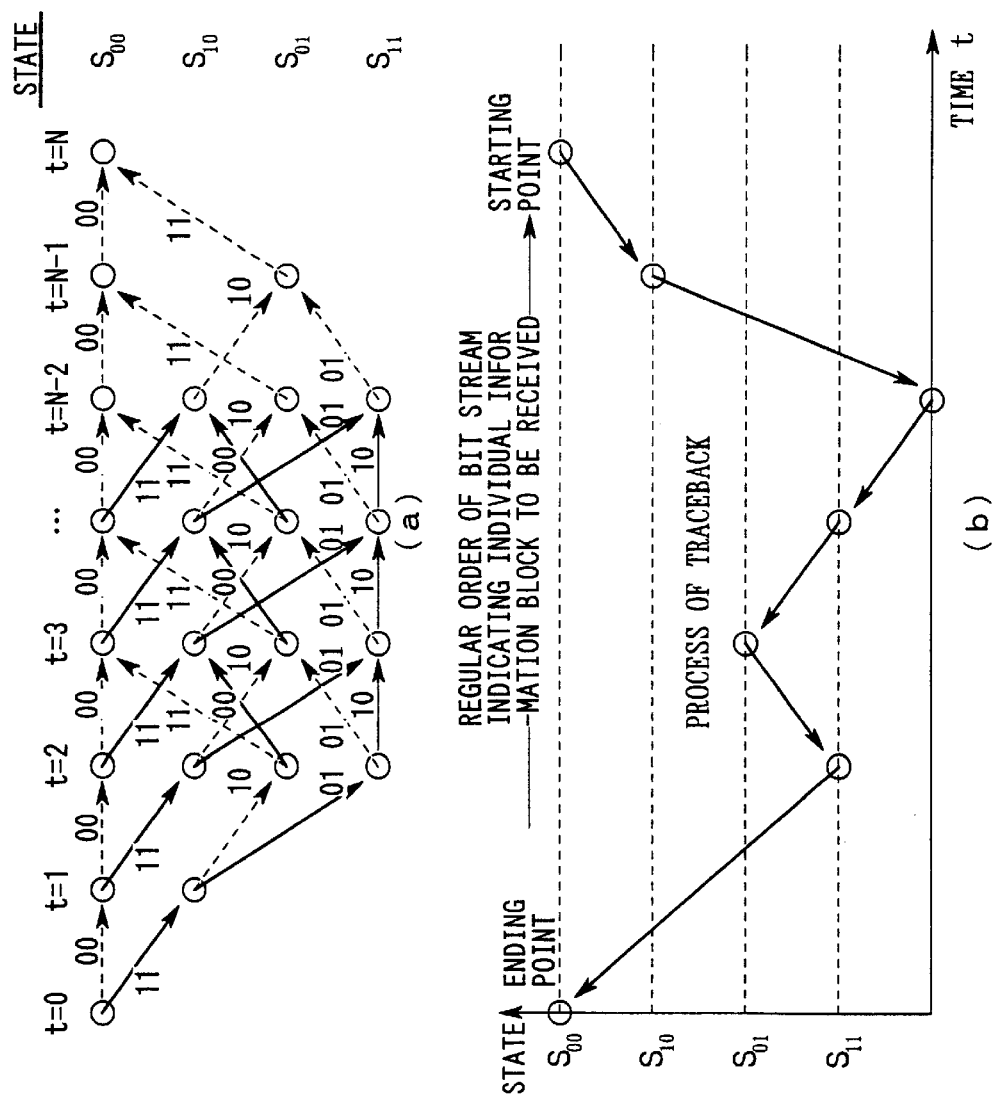

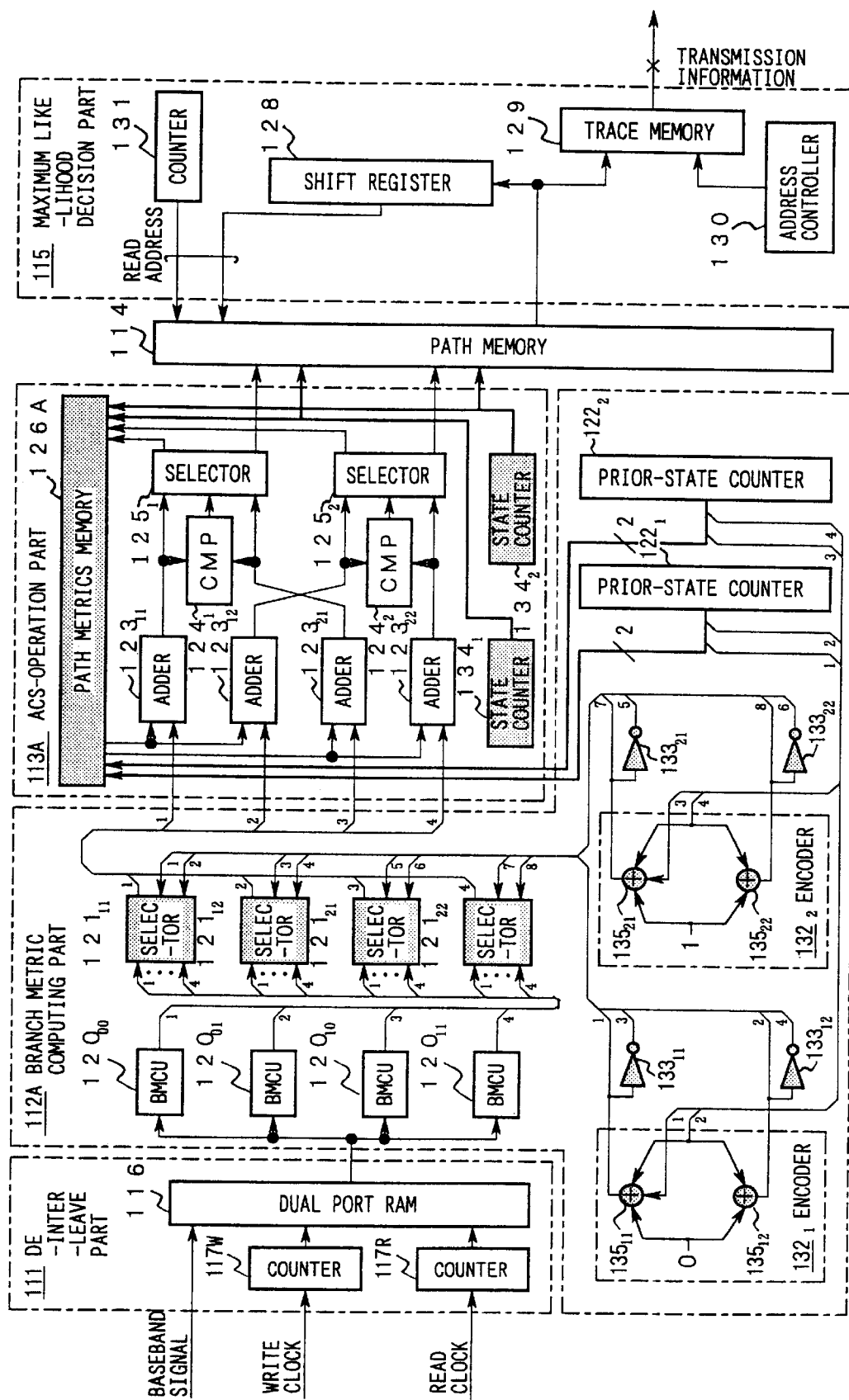

VITERBI DECODER USING A REVERSE TRELLIS DIAGRAM

BACKGROUND OF THE INVENTION

1. Field of the Invention

The present invention relates to a Viterbi decoder for decoding a desired tree code according to a Viterbi algorithm and to a transmitting equipment for coding desired transmission information and then transmitting it to a receiving equipment that incorporates such a Viterbi decoder.

2. Description of the Related Art

Tree codes such as a convolutional code are codes with which the coding gain is kept high in a stable manner without the rate being set high by virtue of the application of a soft decision system according to a Viterbi algorithm to a receiving end even in radio transmission systems in which a high transmission rate and high transmission quality are required in spite of limitations on widening of the transmission bandwidth.

Therefore, in mobile communication systems and satellite communication systems to which such a convolutional code is used, Viterbi decoders are incorporated in many cases in terminals and other equipment that are not only required to be of a low price and a small size but also severely required to be of low power consumption.

FIG. 8 shows the configuration of an exemplary receiving part that incorporates a Viterbi decoder.

As shown in FIG. 8, a baseband signal indicating demodulated transmission information is input to a first input of a de-interleaving part 111. A clock signal (hereinafter referred to as "write clock signal") that is synchronized with the baseband signal and a clock signal (hereinafter referred to as "read clock signal") that is locally generated in a non-illustrated receiving part are supplied to second and third inputs of the de-interleaving part 111, respectively. The output of the de-interleaving part 111 is connected to the input of a branch metric obtaining part 112. The four outputs of the branch metric obtaining part 112 are connected to the corresponding inputs of an ACS-operation part 113. The first to fourth outputs of the ACS-operation part 113 are connected to a writing -port of a path memory 114. Corresponding input/outputs of a maximum likelihood decision part 115 are connected to reading ports of the path memory 114. Transmission information as a maximum likelihood decision result is obtained at the output of the maximum likelihood decision part 115.

The de-interleaving part 111 is composed of a dual port RAM 116 whose writing input is given a baseband signal (mentioned above) and whose reading output is directly connected to the input of the branch metric obtaining part 112, a counter 117W whose counting output is connected to the write address input of the dual port RAM 116 and whose counting input is given a write clock signal, and a counter 17R whose counting output is connected to the read address input of the dual port RAM 116 and whose counting input is given a read clock signal.

The branch metric obtaining part 112 is composed of branch metric computing units (BMCU) $120_{00}$, $120_{01}$, $120_{10}$, and $120_{11}$ whose inputs are connected parallel to the outputs of the de-interleaving part 111 (dual port RAM 116).

The ACS-operation part 113 is composed of adders ($123_{001}$, $123_{012}$), ($123_{011}$, $123_{012}$), ($123_{101}$, $123_{102}$), and ($123_{111}$, $123_{112}$) that are disposed at the first stage and one inputs of which are connected to the outputs of the respective branch metric computing units $120_{00}$, $120_{01}$, $120_{10}$, and $120_{11}$; a comparator (CMP) $124_1$ whose first and second inputs are connected to the outputs of the respective adders $123_{001}$ and $123_{112}$; a comparator (CMP) $124_2$ whose first and second inputs are connected to the outputs of the respective adders $123_{111}$ and $123_{002}$; a comparator (CMP) $124_3$ whose first and second inputs are connected to the outputs of the respective adders $123_{101}$ and $123_{012}$; a comparator (CMP) $124_4$ whose first and second inputs are connected to the outputs of the respective adders $123_{011}$ and $123_{102}$; a selector $125_1$ whose first to third inputs are connected to the outputs of the adders $123_{001}$ and $123_{112}$ and the output of the comparator $124_1$ and one output of which is connected to a corresponding input of the writing port of the path memory 114; a selector $125_2$ whose first to third inputs are connected to the outputs of the adders $123_{111}$ and $123_{002}$ and the output of the comparator $124_2$ and one output of which is connected to a corresponding input of the writing port of the path memory 114; a selector $125_3$ whose first to third inputs are connected to the outputs of the adders $123_{101}$ and $123_{012}$ and the output of the comparator $124_3$ and one output of which is connected to a corresponding input of the writing port of the path memory 114; a selector $125_4$ whose first to third inputs are connected to the outputs of the adders $123_{011}$ and $123_{102}$ and the output of the comparator $124_4$ and one output of which is connected to a corresponding input of the writing port of the path memory 114; a flip-flop (FF) $126_1$ that is disposed between the other output of the selector $125_1$ and the other inputs of the adders $123_{001}$ and $123_{111}$; a flip-flop (FF) $126_2$ that is disposed between the other output of the selector $125_2$ and the other inputs of the adders $123_{101}$ and $123_{011}$; a flip-flop (FF) $126_3$ that is disposed between the other output of the selector $125_3$ and the other inputs of the adders $123_{112}$ and $123_{002}$; and a flip-flop (FF) $126_4$ that is disposed between the other output of the selector $125_4$ and the other inputs of the adders $123_{012}$ and $123_{102}$.

The maximum likelihood decision part 115 is composed of a counter 131 whose output is connected to the address input of the first reading port of the path memory 114, a shift register 128 whose output is connected to the address input of the second reading port of the path memory 114 and whose input is connected to the reading output of the path memory 114, a trace memory 129 whose input is connected to the output of the path memory 114 and that is disposed at the final stage, and an address controller 130 whose output is connected to the address input of the trace memory 129.

In the conventional example having the above configuration, a baseband signal is generated by a demodulator (not shown) for demodulating a received wave that has been received from a transmitting end through a radio transmission channel, the baseband signal being given as an array of code blocks that have been subjected, on the transmitting end, to "interleave processing" (see FIG. 9(a)) for distribution on the time axis to prevent deterioration in transmission quality due to burst errors that may occur on the radio transmission channel.

In the de-interleaving part 111, the counter 117W generates write addresses by counting cyclically write clocks that are synchronized with the baseband signal. The counter 117R generates read addresses by counting read clocks (mentioned above) cyclically.

An array of code blocks (mentioned above) that are given as a baseband signal are sequentially written to storage areas of the dual port RAM 116 in a write address updating order (i.e., in the row direction) indicated by symbol (1) in FIG. 9(b).

The code blocks that have been written in the storage areas of the dual port RAM 116 in the above manner are sequentially read out in a read address updating order (i.e., in the column direction) indicated by symbol (2) in FIG. 9(b).

A bit string representing an array of code words read out from the dual port RAM 116 will be referred to simply as "received sequence" and received signals at time point t is denoted by $(I_t,Q_t)$. Although received signals $(I_t,Q_t)$ may be represented by multiple values with soft decision, for the sake of simplicity it is assumed here that each of $I_t$ and $Q_t$ is represented by a binary value, that is, "0" or "1".

In the branch metric obtaining part 112, the branch metric computing units $120_{00}$, $120_{01}$, $120_{10}$, and $120_{11}$ compute, according to the following formulae, branch metrics (Hamming distances) $\lambda 00(t)$, $\lambda 01(t)$, $\lambda 10(t)$, and $\lambda 11(t)$ that represent differences between received signals $(I_t,Q_t)$ at time point t and "00", "01", "10", and "11", respectively, that are combinations of "0" and "1" that are signals (branch signals) presumed in advance (to have been transmitted from a transmitting end):

$$\lambda_{00}(t) = (I_t \oplus 0) + (Q_t \oplus 0)$$
$$\lambda_{01}(t) = (I_t \oplus 0) + (Q_t \oplus 1)$$
$$\lambda_{10}(t) = (I_t \oplus r1) + (Q_t \oplus 0)$$
$$\lambda_{11}(t) = (I_t \oplus 1) + (Q_t \oplus 1)$$

where the symbol "⊕" means the operator of an exclusive-OR operation.

In the ACS-operation part 113, the adders $123_{001}$, $123_{111}$, $123_{101}$, $123_{011}$, $123_{112}$, $123_{002}$, $123_{012}$, and $123_{102}$ add a branch metric at time point $t_j$ that is produced by the branch metric obtaining part 112 to a path metric that is an accumulation value of branch metrics to time point ti that precedes and is closest to t=0 to $t_j$. Further, the comparators $124_1$–$124_4$ perform magnitude comparison (large or small) on prescribed combinations of results of the above additions. The selectors $125_1$–$125_4$ select small metrics as effective path metrics, and the flip-flops $126_1$–$126_4$ store those path metrics as path metric values to time point $t_j$.

A history of the above selection procedure is recorded in the path memory 114.

An operation performed by the ACS-operation part 133 will be described in a specific manner with reference to FIGS. 10(a) and 10(b).

It is assumed here that a convolutional encoder provided in a transmitting end performs coding in which the rate R of the code is ½ and the constraint length K is 3 and its specific configuration is as shown in FIG. 12 (encoder 136).

In FIGS. 10(a) and 10(b), states $S_{00}$–$S_{11}$ represent values "00" to "11" that are stored in a shift register $136_1$ provided in the transmitting end, that is, in the encoder 136 of FIG. 12.

That is, "0" and "1" signals that are transmission data to become objects of convolutional coding in the transmission end are sequentially input to the shift register $136_1$ and then subjected to prescribed exclusive-OR operations, whereby they are converted into a transmission signal that is a combination $(I_t,Q_t)$ at time point t. The transmission signal is transmitted to a receiving end after being subjected to further processing such as modulation.

Paying attention to the operation of the shift register $136_1$, the values that are stored in accordance with input data vary sequentially, for example, start from initial values "00" and take values listed below, as a result of which process they will finally take one of four kinds of combinations "00" to "11".

"10" (Data "1" is input, whereby "1" is newly stored in the shift register $136_1$ and the first initial data "0" is erased.)

"11" (Data "1" is further input, whereby "1" is newly stored in the shift register $136_1$ and the second initial data "0" is erased.)

Therefore, the shift register $136_1$ that is provided in the transmitting end can take the four kinds of states $S_{00}$–$S_{11}$.

FIG. 10(a) is a trellis diagram showing a process of estimating transitions between the states $S_{00}$–$S_{11}$ in the transmitting end in the receiving end. The ACS-operation part 103 performs a path metrics operation based on this trellis diagram.

The reason why there are only two states that can occur immediately after each state (see arrows in FIG. 10A) is that the data stored in the shift register $136_1$ are replaced by input data one by one.

In FIG. 10(a), numbers "00" to "11" that are associated with solid-line or broken-line arrows represent signals to be received at a receiving end when the state of the shift register $136_1$ at the transmitting end makes transitions in the directions of the arrows, and correspond to signals presumed in advance (branch signals; mentioned above).

In the ACS-operation part 113, the flip-flops $126_1$–$126_4$ store path metrics for the respective states $S_{00}$–$S_{11}$.

When, for example, branch metrics $\lambda_{00}(3)$ and $\lambda_{11}(3)$ at time point t=3 are received from the respective branch metric computing units $120_{00}$ and $120_{11}$, the adder $123_{001}$ adds a path metric (a value stored in the flip-flop $126_1$) for the state S00 at time point t=2 to the branch metric $\lambda_{00}(3)$. The adder $123_{112}$ adds a path metric (a value stored in the flip-flop $126_3$) for the state $S_{01}$ at time point t=2 to the branch metric $\lambda_{11}(3)$.

The comparator $124_1$ compares two addition results and the selector $125_1$ selects a smaller one of the addition results. The flip-flop $126_1$ holds the selected addition result as a path metric at t=3.

The path memory 114 holds, as an optimum prior state, a prior state (in this case, "00" or "01" as a suffix of S) indicating the selected state ($S_{00}$ or $S_{11}$ at t=2) in a storage area corresponding to the address "00" indicating the state $S_{00}$ at time point t=3.

Similarly, a prior state of the state $S_{00}$ at time point t=4 is held in a storage area corresponding to the address "00" at time point t=4. In this manner, prior-state numbers corresponding to respective states are held for each time point.

That is, path metrics operations are performed for all routes from the state $S_{00}$ at t=0 to the state $S_{00}$ at t=3. When transitions are made from two different states (in this case, $S_{00}$ and $S_{01}$) to the same state (in this case, $S_{00}$), a route having a smaller path metric is selected as a more likely route. A selection result is held in the flip-flop $126_1$ as a path metric corresponding to the state $S_{00}$ at t=3, and will be used in subsequent path metrics operations.

That is, in the above processing, since operations are performed efficiently by omitting operations for unnecessary path metrics, only one state transition route is selected as a route that reaches each state at each time point.

In the maximum likelihood decision part 115, the shift register 128, which is initialized for each code block (mentioned above), sequentially captures decoding results output by of the path memory 114 and supplies those to the path memory 114 as read addresses.

The counter 131 performs cyclically, for each code block, processing of decrementing the count value every time a subsequent time point t comes.

Among prior-state numbers that have been selected by the selectors $125_1$–$125_4$ and written to storage areas corresponding to the respective states $S_{00}$–$S_{11}$ at each time point, the path memory 114 outputs a prior state number that corresponds to a time point that is indicated by an address that is supplied to the first reading port from the counter 131 and corresponds to a state (one of $S_{00}$–$S_{11}$) corresponding to an address (one of "00" to "11") that is supplied to the second reading port from the shift register 128.

Not only are such prior-state numbers supplied to the shift register 128 but also their MSB is sequentially stored in the trace memory 129 as the decoding results.

The address controller 130 generates addresses that indicate an array of storage areas that is reverse in order to an array of storage areas of the trace memory 129 to which the above decoding results are written.

The trace memory 129 restores transmission information by sequentially reading out decoding results that were stored in advance in the storage areas indicated by the above addresses.

That is, an array of code blocks that are supplied as a baseband signal is subjected, in the de-interleaving part 111, to de-interleave processing that is reverse to interleave processing that was performed at the transmission end, and also subjected to efficient traceback processing (see FIG. 10(*b*)) and maximum likelihood decision processing according to a Viterbi algorithm under cooperation among the branch metric obtaining part 112, the ACS-operation part 113, the path memory 114, and the maximum likelihood decision part 115.

Therefore, in a radio transmission system that is required to provide a high transmission rate and high transmission quality, the hardware scale and the power consumption can be reduced and a desired coding gain can be obtained in a stable manner even if the transmission bandwidth is not sufficiently wide.

FIG. 11 shows the configuration of another exemplary receiving part that incorporates a Viterbi decoder.

The receiving part of FIG. 11 is different from that of FIG. 8 in that a branch metric obtaining part 112A is provided in place of the branch metric obtaining part 112 and an ACS-operation part 113A is provided in place of the ACS-operation part 113.

The branch metric obtaining part 112A is different, in configuration, from the branch metric obtaining part 112 shown in FIG. 8 in that the former is newly provided with selectors $\mathbf{121_{11}}$, $\mathbf{121_{12}}$, $\mathbf{121_{21}}$, and $\mathbf{121_{22}}$ each having four inputs that are directly connected to all the outputs of the branch metric computing units $\mathbf{120_{00}}$, $\mathbf{120_{10}}$, $\mathbf{120_{01}}$, and $\mathbf{120_{11}}$ and having outputs that are connected to the respective inputs of the ACS-operation part 113A; prior-state counters $\mathbf{122_1}$ and $\mathbf{122_2}$ each having a 2-bit output that is directly connected to the read address input of the ACS-operation part 113A; an encoder $\mathbf{132_1}$ that is disposed between the output of the prior-state counter $\mathbf{122_1}$ and the selection inputs of the selectors $\mathbf{121_{11}}$ and $\mathbf{121_{12}}$; an encoder $\mathbf{132_2}$ that is disposed between the output of the prior-state counter $\mathbf{122_2}$ and the selection inputs of the selectors $\mathbf{121_{21}}$ and $\mathbf{121_{22}}$; inverters $\mathbf{133_{11}}$ and $\mathbf{133_{12}}$ that are disposed between the two outputs of the encoder $\mathbf{132_1}$ and the corresponding selection inputs of the selector $\mathbf{121_{12}}$, respectively; and inverters $\mathbf{133_{21}}$ and $\mathbf{133_{22}}$ that are disposed between the two outputs of the encoder $\mathbf{132_2}$ and the corresponding selection inputs of the selector $\mathbf{121_{21}}$, respectively.

The ACS-operation part 113A is different, in configuration, from the ACS-operation part 113 shown in FIG. 8 in that adders $\mathbf{123_{11}}$, $\mathbf{123_{12}}$, $\mathbf{123_{21}}$, and $\mathbf{123_{22}}$ one inputs of which are connected to the outputs of the respective selectors $\mathbf{121_{11}}$, $\mathbf{121_{12}}$, $\mathbf{121_{21}}$, and $\mathbf{121_{22}}$ are provided in place of the adders $(\mathbf{123_{001}}, \mathbf{123_{002}})$, $(\mathbf{123_{011}}, \mathbf{123_{012}})$, $(\mathbf{123_{101}}, \mathbf{123_{102}})$, and $(\mathbf{123_{111}}, \mathbf{123_{112}})$; that the comparators $\mathbf{124_3}$ and $\mathbf{124_4}$, the selectors $\mathbf{125_3}$ and $\mathbf{125_4}$, and the flip-flops $\mathbf{126_1}$–$\mathbf{126_4}$ are not provided; that the output of the adder $\mathbf{123_{11}}$ is connected to one inputs of the comparator $\mathbf{124_1}$ and the selector $\mathbf{125_1}$; that the output of the adder $\mathbf{123_{21}}$ is connected to the other inputs of the comparator $\mathbf{124_1}$ and the selector $\mathbf{125_1}$; that the output of the adder $\mathbf{123_{12}}$ is connected to one inputs of the comparator $\mathbf{124_2}$ and the selector $\mathbf{125_2}$; that the output of the adder $\mathbf{123_{22}}$ is connected to the other inputs of the comparator $\mathbf{124_2}$ and the selector $\mathbf{125_2}$; that a path metrics memory 126A is provided in place of the flip-flops $\mathbf{126_1}$–$\mathbf{126_4}$ shown in FIG. 8 between one outputs of the respective selectors $\mathbf{125_1}$ and $\mathbf{125_2}$ and the other inputs of the adders $\mathbf{123_{11}}$, $\mathbf{123_{12}}$, $\mathbf{123_{21}}$, and $\mathbf{123_{22}}$; that a state counter $\mathbf{134_1}$ is provided whose output is connected to the first write address input of the path metrics memory 126A and the address input of the first writing port of the path memory 114; and that a state counter $\mathbf{134_2}$ is provided whose output is connected to the second write address input of the path metrics memory 126A and the address input of the second writing port of the path memory 114.

The encoder $\mathbf{132_1}$ is composed of an exclusive-OR gate $\mathbf{135_{11}}$ that is disposed as the final stage, whose first and second inputs are connected to the first and second outputs of the prior-state counter $\mathbf{122_1}$, respectively, and whose third input is given a constant logical value "0", and an exclusive-OR gate $\mathbf{135_{12}}$ that is disposed as the final stage together with the exclusive-OR gate $\mathbf{135_{11}}$, whose first input is connected to the second input of the prior-state counter $\mathbf{122_1}$, and whose second input is given a constant logical value "0".

The encoder $\mathbf{132_2}$ is composed of an exclusive-OR gate $\mathbf{135_{21}}$ that is disposed as the final stage, whose first and second inputs are connected to the first and second outputs of the prior-state counter $\mathbf{122_2}$, respectively, and whose third input is given a constant logical value "1", and an exclusive-OR gate $\mathbf{135_{22}}$ that is disposed as the final stage together with the exclusive-OR gate $\mathbf{135_{21}}$, whose first input is connected to the second input of the prior-state counter $\mathbf{122_2}$, and whose second input is given a constant logical value "1".

In the conventional example having the above configuration, the prior state counter $\mathbf{122_1}$ that is provided in the branch metric obtaining part 112A outputs repeatedly and alternately at a prescribed rate 2-bit prior-state numbers corresponding to the respective states $S_{00}$ and $S_{10}$ (like "00", "10", "00", . . . ) among the prior states $S_{00}$, $S_{10}$, S01, and $S_{11}$ at a time point prior to a time point when the ACS-operation part 113A attempts to compute path metrics.

The prior state counter $\mathbf{122_2}$ output repeatedly and alternately at the same rate 2-bit prior-state numbers corresponding to the respective states $S_{01}$ and $S_{11}$ (like "01", "11", "01", . . . ) among the above-mentioned four states $S_{00}$, $S_{10}$, $S_{01}$, and $S_{11}$.

The above-mentioned rate is set in advance at two times a rate at which the branch metric computing units $\mathbf{120_{00}}$, $\mathbf{120_{10}}$, $\mathbf{120_{01}}$, and $\mathbf{120_{11}}$ compute branch metrics.

The encoders $\mathbf{132_1}$ and $\mathbf{132_2}$ and the inverters $\mathbf{133_{11}}$, $\mathbf{133_{12}}$, $\mathbf{133_{21}}$, and $\mathbf{133_{22}}$ generate branch numbers corresponding to four kinds of states, respectively, that are supplied alternately in an order of time-series from the prior-state counters $\mathbf{122_1}$ and $\mathbf{122_2}$ and cases where the value of a received sequence that is subsequently is given is "0" and "1", respectively.

For the sake of simplicity, it is assumed that such branch numbers conform to convolutional coding in which the rate R of the code is ½ and the constraint length K is 3.

The selectors $\mathbf{121_{11}}$, $\mathbf{121_{12}}$, $\mathbf{121_{21}}$, and $\mathbf{121_{22}}$ sequentially supplies the adders $\mathbf{123_{11}}$, $\mathbf{123_{12}}$, $\mathbf{123_{21}}$, and $\mathbf{123_{22}}$ with branch metrics corresponding to, on a trellis diagram, branches indicated by such a code sequence among branch metrics computed by the branch metric computing units $120_{00}$, $120_{10}$, $120_{01}$, and $120_{11}$.

In the ACS-operation part 113A, the state counters $134_1$ and $134_2$ output state numbers representing the respective states $S_{00}$–$S_{11}$ on a trellis diagram for every lapse, from a time point when the prior-state counters $122_1$ and $122_2$ updated the prior state numbers, of a time that is approximately equal to a propagation delay time (time required for operations) of a closed loop from the input ends of the adders $123_{11}$, $123_{12}$, $123_{21}$, and $123_{22}$ past the comparators $124_1$ and $124_2$, the selectors $125_1$ and $125_2$, and the path metrics memory 126A to the input ends of the adders $123_{11}$, $123_{12}$, $123_{21}$, and $123_{22}$.

The adders $123_{11}$, $123_{12}$, $123_{21}$, and $123_{22}$ add path metrics to branch metrics that are supplied from the branch metrics obtaining part 112A in a prior state corresponding to an address that is supplied by the prior-state counters $122_1$ and $122_2$ to the path metrics memory 126A. The comparators $124_1$ and $124_2$ compares results of those additions, causes storage, as a path metric of each state, of a smaller one of the two in a storage area of the path-metrics memory 126A that is indicated by an address that is supplied from the state counters $134_1$ and $134_2$, and causes storage of a history of such a selection procedure in the path memory 114 at each time point.

That is, in the Viterbi decoder shown in FIG. 8, many adders, comparators, etc. are needed for obtaining path metrics and selection histories at the same time for the above-mentioned four states. However, in the Viterbi decoder shown in FIG. 11, since path metrics operations and other operations relating to respective states are performed in a time-divisional manner in synchronism with the operations of the prior-state counters $122_1$ and $122_2$ and the state counters $134_1$, and $134_2$, the same components are shared by plural kinds of processing and hence the configuration can be simplified.

Incidentally, in each of the above conventional examples, since a decoding result obtained with the path memory 114 is one given as a result of the above-described traceback processing, it is a bit string that is arranged in order that is reverse to the order of transmission from the transmitting end to the transmission channel.

Therefore, to perform processing of again reversing the order of such a bit string, the maximum likelihood decision part 115 is provided with the trace memory 129 and the address controller 130, which are a factor of increasing the hardware scale.

Such processing takes not only an access time that is specific to the trace memory 129 but also a time corresponding to a difference between time points that conform to propagation delay times and response times specific to the ACS-operation part 113 or 113A and the maximum likelihood decision part 115 and when writing and reading are performed reliably on individual storage areas of the trace memory 129.

However, such a time corresponds to part of transmission delay times that inherently occur in a transmission system. Therefore, the higher the required transmission rate is, the more necessary it is to use high-speed devices to form the branch metric obtaining part 112 or 112A, the ACS-operation part 113 or 113A, the path memory 114, and the maximum likelihood decision part 115.

Further, in general, such high-speed devices consume more power than low-speed devices. Therefore, particularly in equipment such as portable communication terminal equipments, because of limitation is relating to the high-density mounting and the thermal designing, it is difficult to realize desired reduction in weight, size, and price and a desired continuous operation time unless changes in certain specifications or deterioration in performance is permitted.

SUMMARY OF THE INVENTION

An object of the present invention is to provide a Viterbi decoder and a transmitting equipment which make it possible to simplify the hardware configuration without deteriorating the transmission quality.

Another object of the invention is to restore transmission information without reversing on the time series as long as the state of the encoder is reliably set to a known initial state such as an all-zero state at both the starting and the ending point in time of the coding.

Another object of the invention is to heighten the decoding efficiency and increase the flexibility of configuration.

Another object of the invention is to simplify the hardware configuration.

Still another object of the invention is to make it possible to apply the invention to a receiving end irrespective of functional distribution with a transmitting end located on the other side of a transmission channel.

A further object of the invention is to make it possible to apply the invention to a receiving end without making the configuration more complex under the circumstance where the hardware for de-interleave processing conforming to interleave processing performed at the transmitting end performs another process.

Another object of the invention is to implement a receiving end with small-scale hardware.

Another object of the invention is to increase the flexibility relating to the standardization, designing, maintenance, and operation of equipment that constitutes a transmission system to which the invention is applied, and a attain reduction in running cost and increase in reliability without deteriorating the performance or service quality.

The above objects are attained by a Viterbi decoder in which path metrics are sequentially computed by adapting to a reverse trellis diagram obtained by reversing the order of time-series of a trellis diagram indicating, in the order of time-series, states that an encoder used for coding can be in, and in which decoding is performed by the ACS operation according to the computed path metrics.

In the above Viterbi decoder, each code block is decoded normally even in a case where it is supplied as a code word obtained by reversing the order of time-series of a bit string included in the code word in the above-described manner as long as the state of the encoder is reliably set to a known initial state such as an all-zero state at both the starting and the ending points in time of the coding. Transmission information is restored as an array of survivors without having the order of time-series reversed.

The above objects are attained by a Viterbi decoder which has an encoder that performs a reverse operation on the time series according to an ordinary trellis diagram, and in which path metrics corresponding to states (paths) that are given as a code sequence obtained by the encoder are sequentially computed.

In the above Viterbi decoder, not only the decoding efficiency is heightened, but also the flexibility of configuration is increased.

The above objects are attained by a Viterbi decoder in which the above-mentioned code sequence is stored in advance as values adapted to a coding system used for the code sequence and is used in place of a code sequence supplied from the encoder.

In the above Viterbi decoder, ACS operations can be performed serially within the range that the components can respond, and the configuration can be made simpler than in a case where the ACS operations are performed in parallel.

The above objects are attained by a Viterbi decoder in which the reversing of the order on the time series of a bit string of each of the code blocks that are given as a received sequence is restored prior to the computation of path metrics.

In the above Viterbi decoder, branch metrics can be computed even in a case where code words to be referred to for computation of the branch metrics are not supplied directly through the transmission channel.

The above objects are attained by a Viterbi decoder in which the processing of reversing the order of the time series of a bit string of each of code blocks is performed together with de-interleave processing that conforms to interleave processing that was performed at a transmitting end.

In the above Viterbi decoder, the configuration is simplified even when interleave processing is performed in a transmission system at the transmitting end, by using another section that performs de-interleave processing that conforms to the interleave processing at the receiving end.

The above objects are attained by a transmitting equipment which transmits, to a receiving equipment incorporating the above-described Viterbi decoder, transmission information that includes a bit sequence obtained by splitting transmission information into pieces having a prescribed word length and reversing the order on the time series after being subjected to a coding process that conforms to the Viterbi decoder.

Since processing that is equivalent to the reverse processing to be performed in the above-described Viterbi decoder is performed in the above transmitting equipment, the receiving end can incorporate the Viterbi decoder without enlarging the hardware scale.

The above objects are attained by a transmitting equipment which performs the processing of reversing the order of time series together with interleave processing.

With the above transmitting equipment, a transmitting system that conforms to a receiving end incorporating the above-described Viterbi decoder can be realized at a low cost without making the hardware configuration more complex.

Other objects and features of the invention will become apparent from the following detailed description taken in connection with the accompanying drawings.

BRIEF DESCRIPTION OF THE DRAWINGS

In the accompanying drawings:

FIG. 8 shows the configuration of a conventional receiving art that incorporates a Viterbi decoder;

FIG. 9 illustrates processes of interleave processing and de-interleave processing;

FIG. 10 illustrates an operation of the conventional example;

FIG. 11 shows the configuration of another conventional receiving part that incorporates a Viterbi decoder.

DETAILED DESCRIPTION OF THE PREFERRED EMBODIMENTS

First, the principles of Viterbi decoders according to the invention will be described with reference to FIG. 1.

Figure 1:
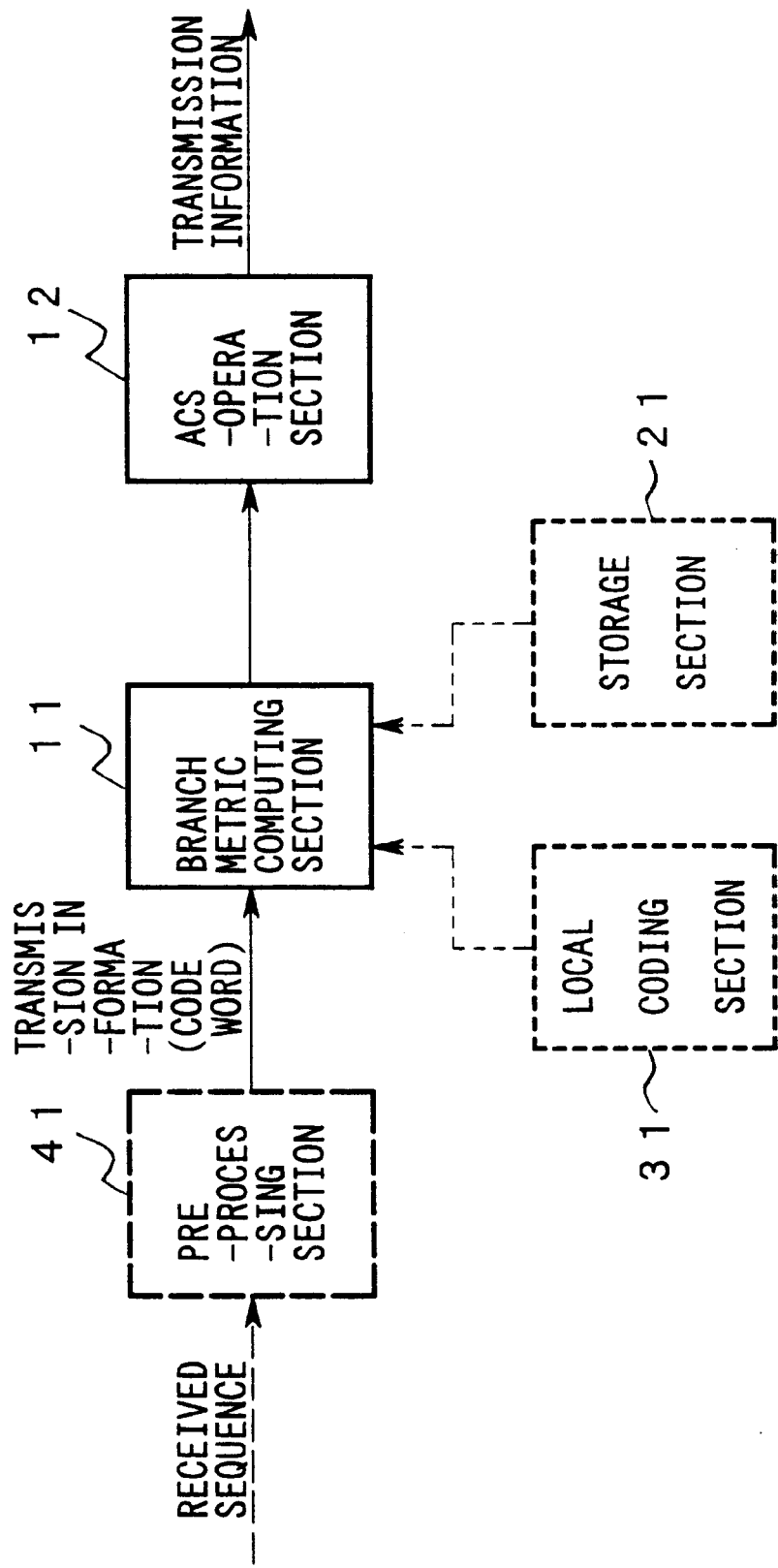
FIG. 1 is a block diagram showing the principles of Viterbi decoders according to the invention.

FIG. 1 is a block diagram showing the principles of Viterbi decoders according to the invention. 10 The Viterbi decoders shown in FIG. 1 are composed of part or all of a branch metric computing section 11, an ACS-operation section 12, a storage section 21, a local coding section 31, and a pre-processing section 41.

The principle of a first Viterbi decoder according to the invention is as follows.

The branch metric computing section 11 is supplied with individual code blocks that are generated by tree-coding transmission information as code words each of whose orders of time-series of a bit string included in the code blocks are reversed, and computes, in order of time-series in which each of the code words is supplied, branch metrics corresponding to all branches that are formed between each state Sj that an encoder that was used in the tree-coding of the transmission information can be in at a time point tj by and a state Si that the same can be in at a time point ti that precedes the time point tj. The ACS-operation section 12 performs an ACS operation on the branch metrics computed by the branch metric computing section 11 in order of time-series in which the branch metrics were computed, and thereby restores the transmission information as an array of survivors.

The operation of the first Viterbi decoder having the above configuration is as follows.

The branch metric computing section 11 is supplied with individual code blocks that are generated by tree-coding transmission information as code words each of whose orders of time-series of a bit string included in the code block are reversed. Further, the branch metric computing section 11 computes, in order of time-series in which each of the code words is supplied, branch metrics corresponding to all branches that are formed between each state Sj that an encoder that was used in tree-coding the transmission information can be in at a time point tj by and a state Si that the same can be in at a time point ti that precedes the time point tj. The ACS-operation section 12 performs an ACS operation on the branch metrics in the order of time-series in which the branch metrics was computed, and thereby obtains an array of survivors.

The branch metric computing section 11 and the ACS-operation section 12 adapt to a reverse trellis diagram obtained by reversing the order of time-series of a trellis diagram indicating a code sequence that can be generated by the above-mentioned encoder, and cooperate to perform decoding processing according to a Viterbi algorithm.

Therefore, each code block is decoded normally even in a case where it is supplied as a code word obtained by reversing the order of time-series of a bit string included in the code blocks in the above-described manner as long as the state of the encoder is reliably set to a known initial state such as an all-zero state at both the starting and ending points in time of the coding. Transmission information is restored as an array of survivors without having the order of time-series reversed.

The principle of a second Viterbi decoder according to the invention is as follows.

States that the encoder can be in, in an order of time-series in a process of tree-coding the transmission information, are stored in the storage section 21 in an order reverse the order of time series. The branch metric computing section 11 computes the branch metrics for branches that are adapted to the respective states stored in the storage section 21 in an order reverse the order of time-series.

The operation of the second Viterbi decoder having the above configuration is as follows. States States that the encoder can be in, in an order of time-series in a process of tree-coding the transmission information, are stored in the storage section 21 in an order reverse the order of time series. The branch metric computing section 11 computes the branch metrics for branches that are adapted to the respective states stored in the storage section 21 in an order reverse the order of time-series.

As long as a reverse trellis diagram can be defined in advance, branches for which branch metrics are to be computed are obtained at a high speed within the range the storage section 21 can respond without execution of any operation by a sequential circuit. Since branches that are adapted to a coding form are stored in the storage section 21 even when the form of coding to be applied has-changed or a plurality of coding forms exist, not only is there heightening of the decoding efficiency, but also increasing of the flexibility of configuration.

The principle of a third Viterbi decoder according to the invention is as follows.

The local coding section 31 simulates states that the encoder are in, in an order of time-series, in tree-coding the transmission information in an order reverse the order of time-series. The branch metric computing section 11 computes the branch metrics for branches that are adapted to the respective simulated states.

The operation of the third Viterbi decoder having the above configuration is as follows.

The local coding section 31 simulates in order reverse the order of time-series, states that the encoder is in, in an order of time-series in tree-coding the transmission information. The branch metric computing section 11 computes the branch metrics for branches that are adapted to the respective simulated states.

Branches for which branch metrics are to be computed are given under the local coding section 31 that makes, in a serial manner, responses that are reversible to responses to they time-series of the encoder that was actually used.

Therefore, the ACS-operation part 12 can perform ACS operations in a serial manner within the range that the local coding section 31 and the branch metric computing section 11 can respond, and hence the configuration of the ACS-operation section 12 can be made simpler than in a case where such ACS operations are performed in parallel.

The principle of a fourth Viterbi decoder according to the invention is as follows.

The pre-processing section 41 generates the code words by performing reverse processing on code blocks that are supplied as a received sequence, to reverse the order of a bit string that is included in each of the code blocks in an order of time-series, and supplies the generated code words to the branch metric computing section 11.

The operation of the fourth Viterbi decoder having the above configuration is as follows.

The pre-processing section 41 generates the code words by performing reverse processing on code blocks that are supplied as a received sequence, to reverse the order of a bit string that is included in each of the code blocks in an order of time-series, and supplies the generated code words to the branch metric computing section 11.

Even where code words to be referred to for computation of branch metrics are not supplied directly through a transmission channel, the branch metric computing section 11 can compute branch metrics. Therefore, the Viterbi decoder according to the invention can be applied to a receiving end irrespective of the form of-functional distribution with a transmitting end that is located on the other side of the communication channel.

The principle of a fifth Viterbi decoder according to the invention is as follows.

The pre-processing section 41 performs, on the code blocks given as the received sequence, in addition to the reversing processing, de-interleave processing that conforms to interleave processing that was performed at a transmitting end that incorporates the encoder.

The operation of the fifth Viterbi decoder having the above configuration is as follows.

The pre-processing section 41 performs, on the code blocks supplied as the received sequence, in addition to the reversing processing, de-interleave processing that conforms to interleave processing that was performed at a transmitting end that incorporates the encoder.

The above de-interleave processing and the reversing processing are generally and simultaneously performed according to a sequence of addresses that is given to a memory used for the writing or reading of a received sequence (code blocks), and that indicate storage areas to be subjected to one or both of the writing and reading.

Even in a transmission system in which interleave processing is performed-at the transmitting end, applying the Viterbi decoder according to the invention without making its configuration more complex is possible, by using another section that performs de-interleave processing that conforms to the interleave processing at the receiving end.

Figure 2:
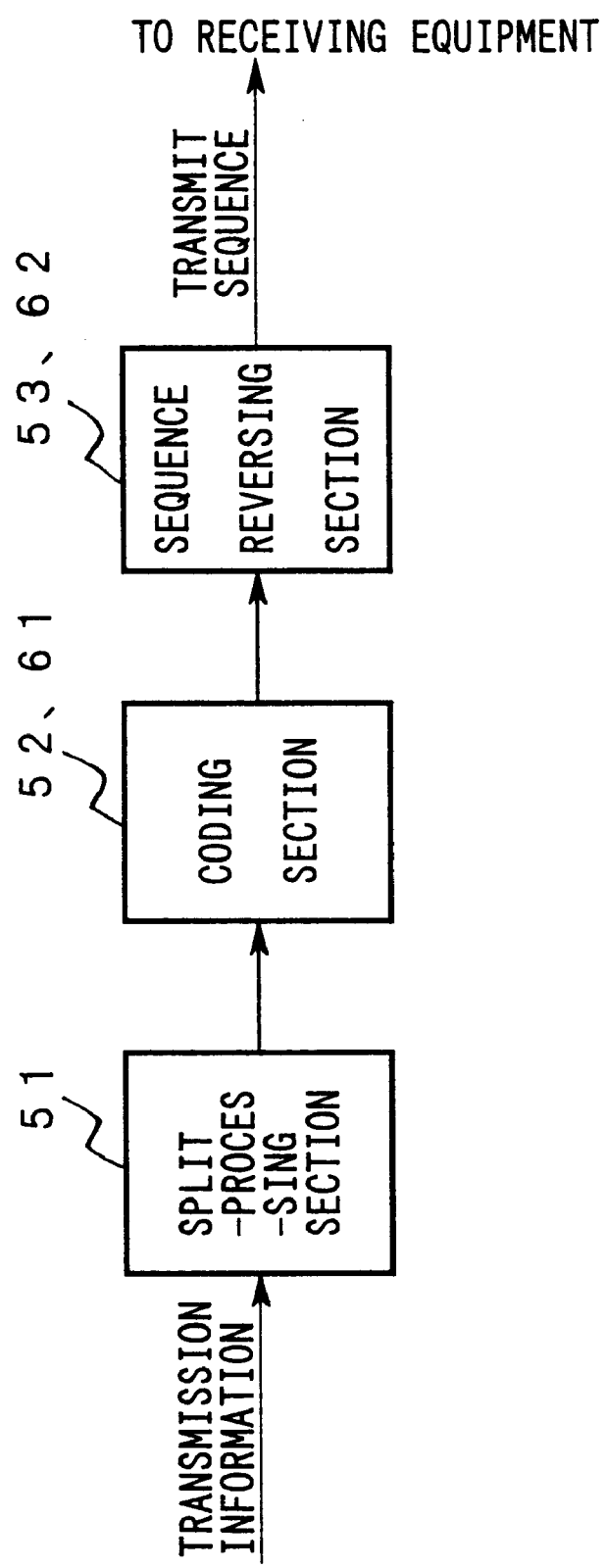
FIG. 2 is a block diagram showing the principles of transmitting equipments according to the invention.

FIG. 2 is a block diagram showing the principles of transmitting equipments according to the invention.

The transmitting equipments shown in FIG. 2 are composed of a split-processing section 51, a coding section 52 or 61, and a sequence reversing section 53 or 62.

The principle of a first transmitting equipment according to the invention is as follows.

The split-processing section 51 splits transmission information and thereby generates an array of information blocks representing the transmission information. The coding section 52 generates an array of code words by tree-coding each array of information blocks. The sequence reversing section 53 generates a transmission sequence by reversing the order of a bit string included in each of the array of code words in order of time-series, and transmits the generated transmission sequence.

The operation of the first transmitting equipment having the above configuration is as follows.

The split-processing section 51 splits transmission information and thereby generates an array of information blocks representing the transmission information. The coding section 52 generates an array of code words by tree-coding each array of information blocks. The sequence reversing section 53 generates a transmission sequence by reversing the order of a bit string included in each of the array of code words in order of time-series, and transmits the generated transmission sequence.

Since the sequence reversing section 53 performs processing that is equivalent to the reverse processing to be performed by the pre-processing section 41, the receiving end can incorporate the Viterbi decoder according to the invention without enlarging the hardware scale at the receiving end.

The principle of a second transmitting equipment according to the invention is as follows.

The split-processing section 51 splits transmission information and thereby generates an array of information blocks representing the transmission information. The coding section 61 generates an array of code words by tree-coding each array of information blocks. The sequence reversing section 62 generates a transmission sequence by performing interleave processing and reversing the order of a bit string included in each of the array of code words in order of time-series, and transmits the generated transmission sequence.

The operation of the second transmitting equipment having the above configuration is as follows.

The split-processing section 51 splits transmission information and thereby generates an array of information blocks representing the transmission information. The coding section 61 generates an array of code words by tree-coding each array of information blocks. The sequence reversing section 62 generates a transmission sequence by performing interleave processing and processing of reversing the order of a bit string included in each of the array of code words in order of time-series, and transmits the generated transmission sequence.

Incidentally, the reverse processing and the interleave processing performed by the sequence reversing section 62 are equivalent to and reversible to the reverse processing and the interleave processing, respectively, to be performed by the pre-processing section 41 in the above-described Viterbi decoder. Further, the above reverse processing and interleave processing are generally performed according to a sequence of addresses that is given to a memory used to write or read to or from a transmission sequence (code blocks), and that indicate storage areas of the memory to be subjected to one or both of the writing and reading.

Therefore, a transmitting system that conforms to a receiving end incorporating the above-described Viterbi decoder according to the invention can be realized at a low cost without making the hardware configuration more complex.

Embodiments of the invention will be hereinafter described in detail with reference to the accompanying drawings.

Figure 3:
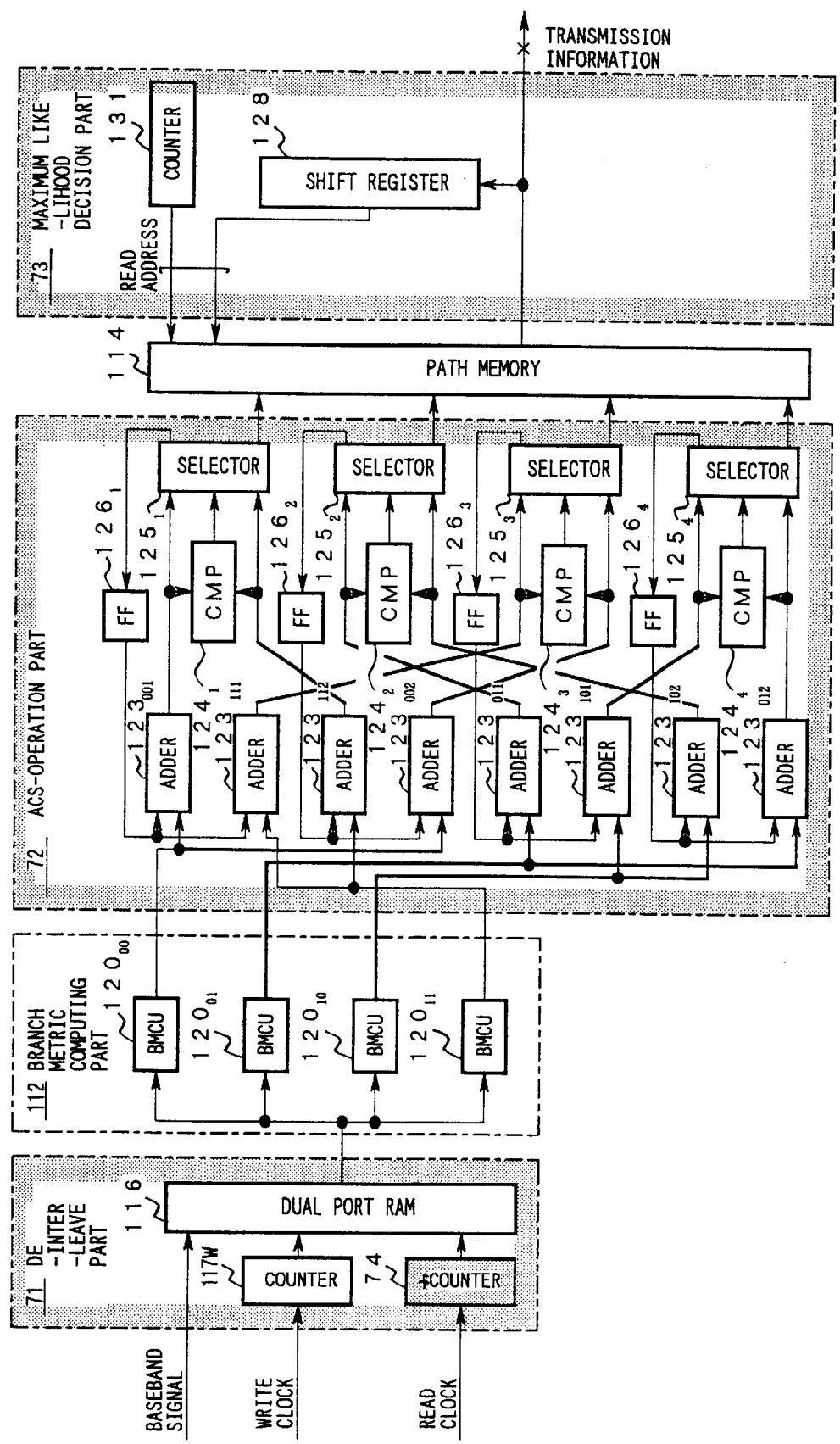
FIG. 3 shows a first embodiment of the invention.

FIG. 3 shows a first embodiment of the invention.

The components in FIG. 3 that are the same in configuration as corresponding components in FIG. 8 are given the same reference symbols as the latter and descriptions therefore will be omitted.

The first embodiment is different in configuration from the conventional example of FIG. 8 in that a de-interleaving part 71 is provided in place of the de-interleaving part 111, an ACS-operation part 72 is provided in place of the ACS-operation part 113, and a maximum likelihood decision part 73 is provided in place of the maximum likelihood decision part 115.

The de-interleaving part 71 is different from the de-interleaving part 111 in that a counter 74 is provided in place of the counter 117R.

In the ACS-operation part 72, as in the case of the conventional example of FIG. 8 one inputs of the adders ($123_{001}$, $123_{002}$), ($123_{011}$, $123_{012}$), ($123_{101}$, $123_{102}$), and ($123_{111}$, $123_{112}$) that are disposed at the first stage are connected to the outputs of the branch metric computing units $120_{00}$, $120_{01}$, $120_{11}$, and $120_{11}$ that are provided in the branch metric obtaining part 112.

However, in this embodiment, to clearly correlate the adders ($123_{001}$, $123_{002}$), ($123_{011}$, $123_{012}$), ($123_{101}$, $123_{102}$), and ($123_{111}$, $123_{112}$) with a "reverse trellis diagram" (described later), they are arranged in order of the adders $123_{001}$, $123_{111}$, $123_{112}$, $123_{002}$, $123_{01}$, $123_{101}$, $123_{102}$, and $123_{012}$.

The ACS-operation part 72 is different from the ACS-operation part 113 in that the output of the adder $123_{112}$ rather than the output of the adder $123_{111}$ is connected to one inputs of the comparator $124_1$ and the selector $125_1$; the output of the adder $123_{011}$ rather than the output of the adder $123_{101}$ is connected to one inputs of the comparator $124_2$ and the selector $125_2$; the output of the adder $123_{102}$ rather than the output of the adder $123_{011}$ is connected to the other inputs of the comparator $124_2$ and the selector $125_2$; the output of the adder $123_{111}$ rather than the output of the adder $123_{112}$ is connected to one inputs of the comparator $124_3$ and the selector $125_3$ ; the output of the adder $123_{101}$ rather than the output of the adder $123_{012}$ is connected to one inputs of the comparator $124_4$ and the selector $125_4$; the output of the adder $123_{012}$ rather than the output of the adder $123_{102}$ is connected to the other inputs of the comparator $124_4$ and the selector $125_4$; the output of the flip-flop $126_2$ is connected to the other inputs of the adders $123_{112}$ and $123_{002}$ rather than the other inputs of the adders $123_{101}$ and $123_{011}$; and the output of the flip-flop $126_3$ is connected to the other inputs of the adders $123_{011}$ and $123_{101}$ rather than the other inputs of the adders $123_{112}$ and $123_{002}$.

The maximum likelihood decision part 73 is different from the maximum likelihood decision part 115 in that the trace memory 129 and the address controller 130 are not provided and transmission information is given directly to the output of the path memory 114.

The operation of the first embodiment will be described below.

In the de-interleave part 71, the counter 117W generates write addresses in the same manner as in the conventional example of FIG. 8 and supplies the generated write addresses to the dual port RAM 116.

Figure 4:
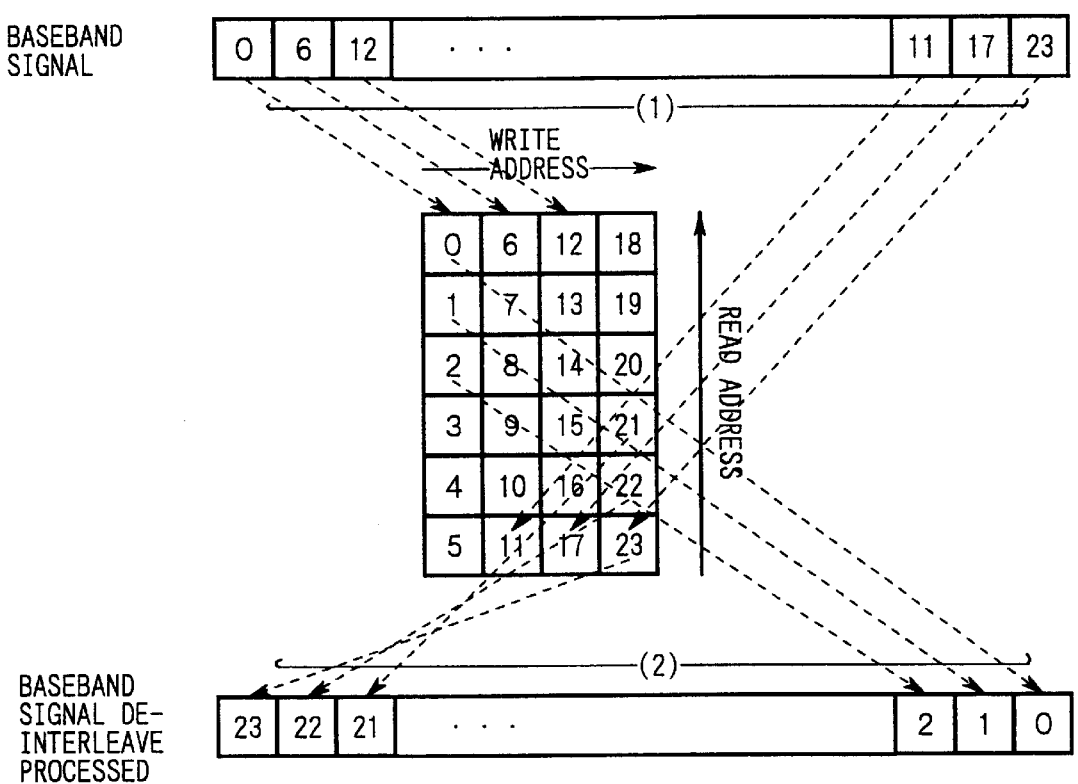
FIG. 4 illustrates an operation of a de-interleaving processing part of the first embodiment.

Therefore, as indicated by symbol (1) in FIG. 4, an array of code blocks supplied as a baseband signal is sequentially written to the dual port RAM 116 in the same order as in the conventional example (indicated by symbol (1) in FIG. 9(b)).

However, the counter 74 performs counting that is reverse in order to the counting that is performed by the counter 117R shown in FIG. 8, and supplies count values, that is, results of the counting, to the dual port RAM 116 as read addresses.

Therefore, an array of code blocks (hereinafter referred to as "reverse code blocks") that is arranged in order of time-series that is reverse the order of time-series of code blocks obtained at the output of the de-interleaving part 111 shown in FIG. 8 is obtained at the output of the de-interleaving part 71 (dual port RAM 116) (indicated by symbol (2) in FIG. 4).

The branch metric obtaining part 112 computes branch metrics according to such reverse code blocks in the same manner as in the conventional example.

Figure 5:
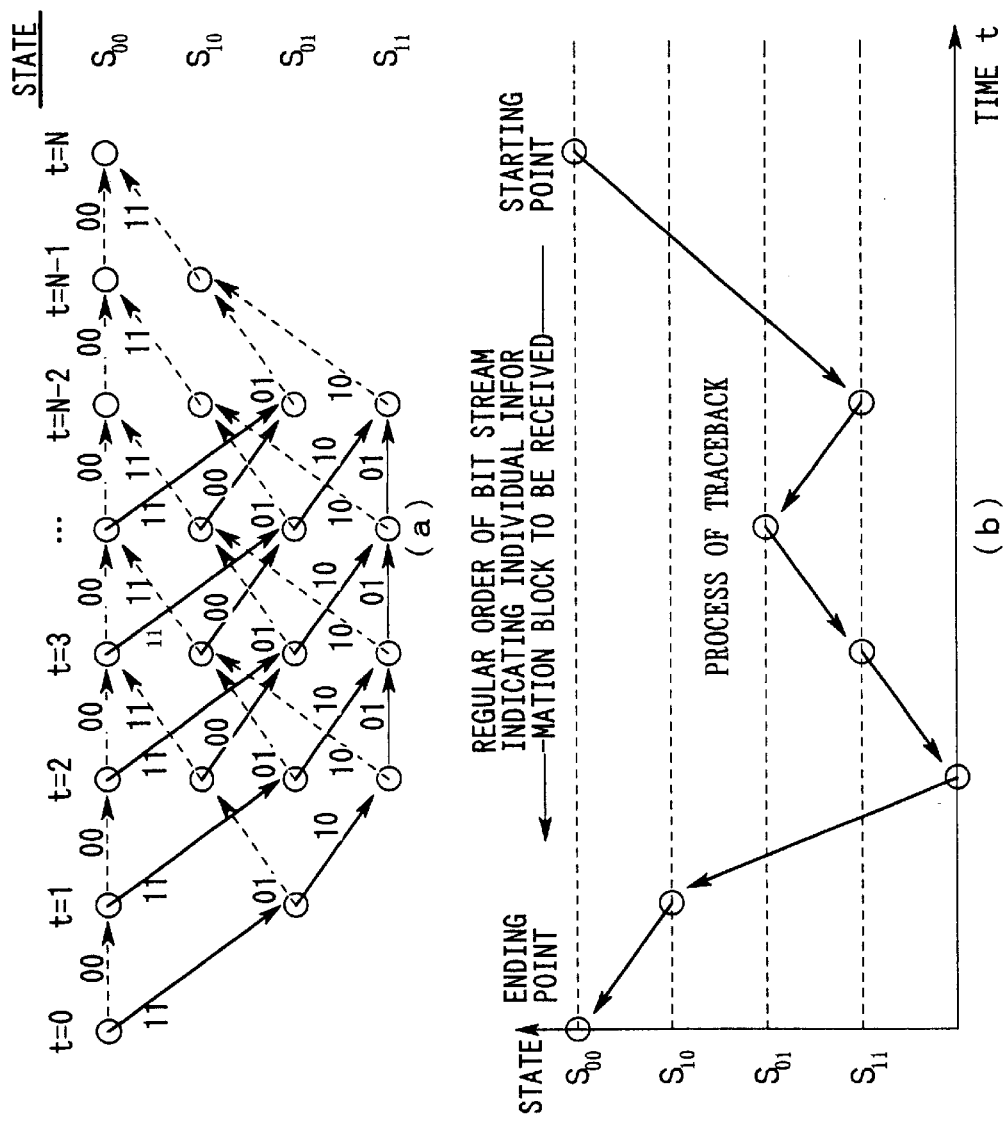
FIG. 5 illustrates an operation of the first embodiment.

In the ACS-operation part 72, a circuit that conforms to a reverse trellis diagram that is reverse in order (with respect to time t) to the trellis diagram shown in FIG. 10($a$) is formed as shown in FIG. 5($a$) in accordance with the manners of connection between the adders $123_{001}$, $123_{111}$, $123_{112}$, $123_{002}$, $123_{011}$, $123_{101}$, $123_{102}$, and $123_{012}$ and the inputs of the comparators $124_1$–$124_4$ and the selectors $125_1$–$125_4$.

Therefore, a selection history (such as prior-state numbers) is stored in the path memory 114 in order of time-series that is reverse to that in the conventional example.

In the maximum likelihood judgement part 73, traceback is performed by reading out the selection history (such as prior-state numbers) stored in the path memory 114 according to addresses that are given by the counter 131 and the shift register 128 in order of time-series that is reverse to that in the conventional example. Therefore, transmission information is obtained in regular order at the output of the path memory 114.

That is, the order of updating of the read address for the dual port RAM 116 for de-interleave processing is set reverse to that of the conventional example, and traceback (see FIG. 5($b$)) is performed reliably according to a Viterbi algorithm that is adapted to the above-mentioned reverse trellis diagram in cooperation with the ACS-operation part 72 whose configuration is not much different from the configuration of the ACS-operation part 113.

Therefore, the maximum likelihood decision part 73 is not provided with the trace memory 129 and the address controller 130 of the conventional example, and hence the decoding is performed more efficiently without any delay that would otherwise occur in the trace memory 129.

Figure 6:
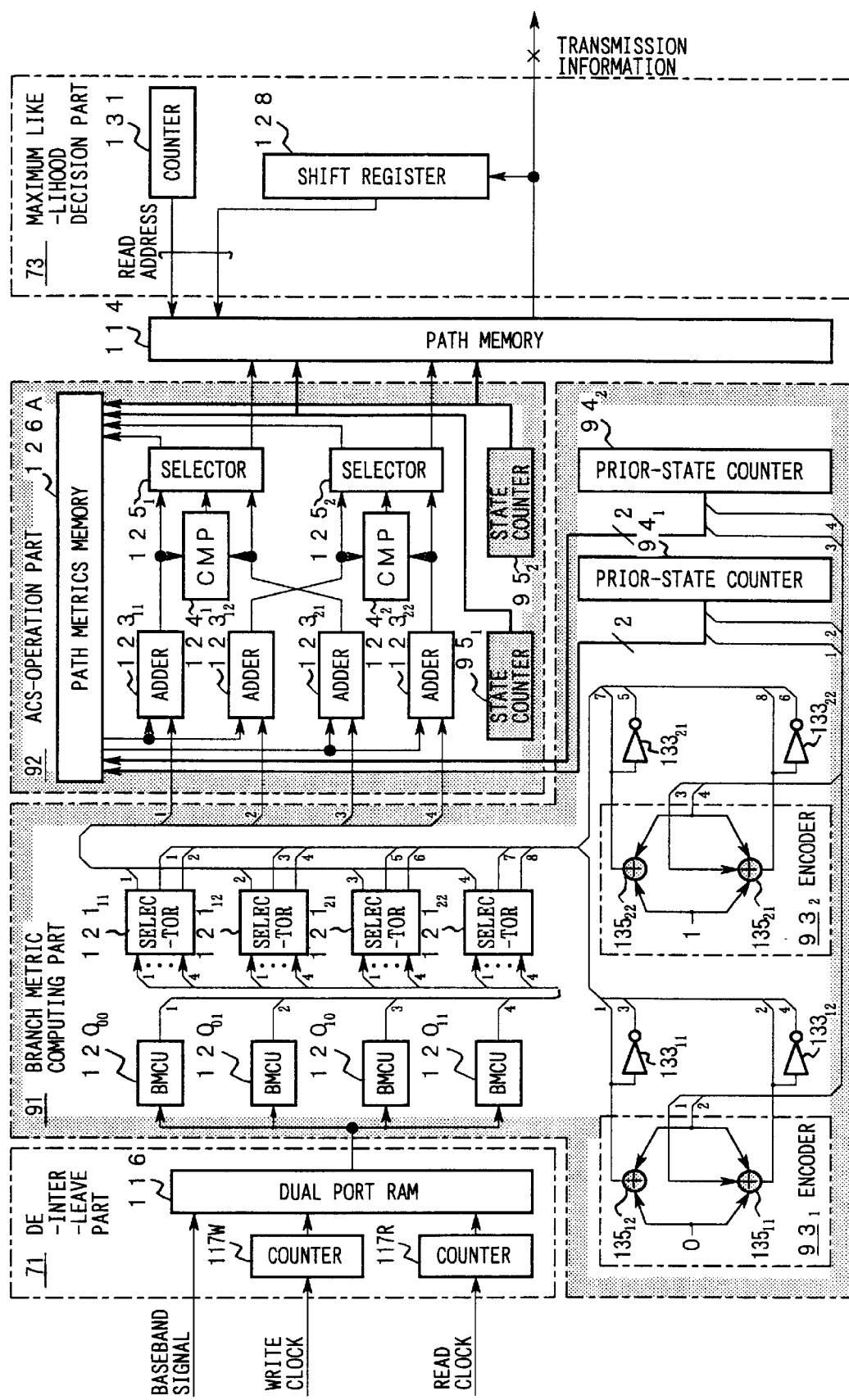
FIG. 6 shows a second embodiment of the invention.

FIG. 6 shows a second embodiment of the invention.

The components in FIG. 6 that are the same in function and configuration as corresponding components in FIG. 3 or 11 are given the same reference symbols as the latter and descriptions therefore will be omitted.

The second embodiment is different in configuration from the conventional example of FIG. 11 in that a branch metric obtaining part 91 is provided in place of the branch metric obtaining part 112A, that an ACS-operation part 92 is provided in place of the ACS-operation part 113A, and that the de-interleaving part 71 and the maximum likelihood decision part 73 shown in FIG. 3 are provided in place of the de-interleaving part 111 and the maximum likelihood decision part 115.

The branch metric obtaining part 91 is different in configuration from the branch metric obtaining part 112A shown in FIG. 11 in that encoders $93_1$ and $93_2$ are provided in place of the encoders $132_1$ and $132_2$, and that prior-state counters $94_1$ and $94_2$ are provided in place of the prior-state counters $122_1$ and $122_2$.

The ACS-operation part 92 is different in configuration from the ACS-operation part 113A shown in FIG. 11 in that state counters $95_1$ and $95_2$ are provided in place of the state counters $134_1$ and $134_2$.

The encoder $93_1$ and the encoder $132_1$ are different from each other in configuration in that the two outputs of the exclusive-OR gates $135_{11}$ and $135_{12}$ are connected to the selection input of the selector $121_{11}$ and the inputs of the inverters $133_{11}$ and $133_{22}$ with reverse combinations.

The encoder $93_2$ and the encoder $132_2$ are different from each other in configuration in that the two outputs of the exclusive-OR gates $135_{21}$ and $135_{22}$ are connected to the selection input of the selector $121_{21}$ and the inputs of the inverters $133_{21}$ and $133_{22}$ with reverse combinations.

The operation of the second embodiment will be described below.

Since as described above the outputs of the encoders $93_1$ and $93_2$ are connected to the selectors $121_{11}$ and $121_{22}$ and the inverters $133_{11}$, $133_{12}$, $133_{21}$, and $133_{22}$ with reverse combinations (bit by bit), the encoders $93_1$ and $93_2$ output code sequences (hereinafter referred to as "reverse code arrays") that conform to the reverse trellis diagram shown in FIG. 5($a$) and are reverse in order to the order of time-series of code sequences that are generated by the convolutional encoders $132_1$ and $132_2$ shown in FIG. 11.

The prior-state counters $94_1$ and $94_2$ repeatedly output arrays of state numbers ("00", "01", "01", . . . ) and ("10", "11", "10", . . . ) that conform to the reverse trellis diagram.

Similarly, the state counters $95_1$ and $95_2$ repeatedly output arrays of counting values ("00", "10", "00", . . . ) and ("01", "11", "01", . . . ) that conform to the reverse trellis diagram.

Among the components of the branch metric obtaining part 91 and the ACS-operation part 92, the components other than the encoders $93_1$ and 932, the prior-state counters $94_1$ and $94_2$, and the state counters $95_1$ and $95_2$ cooperate with each other in the same manner as in the conventional example of FIG. 11, are shared in a time-divisional manner in accordance with reverse code array(s) (mentioned above), and perform the above-described processing.

Therefore, the branch metric obtaining part 91 and the ACS-operation part 92 are formed as smaller-scale hardware than in the embodiment of FIG. 3, and can perform processing that is equivalent to the above-described processing performed by the branch metric obtaining part 112 and the ACS-operation part 72 shown in FIG. 3.

Although in this embodiment reverse code arrays (mentioned above) are generated by the encoder $93_1$ and $93_2$, such reverse code arrays may be generated by a ROM corresponding to the storage means 21 shown in FIG. 1 or any other kind of circuit that makes a response that is equivalent to the time-series response of the encoders $93_1$ and $93_2$.

In each of the above embodiments, the processing that is performed in the conventional examples under cooperation between the trace memory 129 and the address controller 130 is performed together with the de-interleave processing by the de-interleaving part 71 provided at the first stage.

However, where the invention is applied to a transmission system in which no interleave processing is performed at a transmission end, the above-described means for obtaining reverse code blocks without performing deinterleave processing may be provided at the transmitting end rather than at a receiving end.

Figure 7:
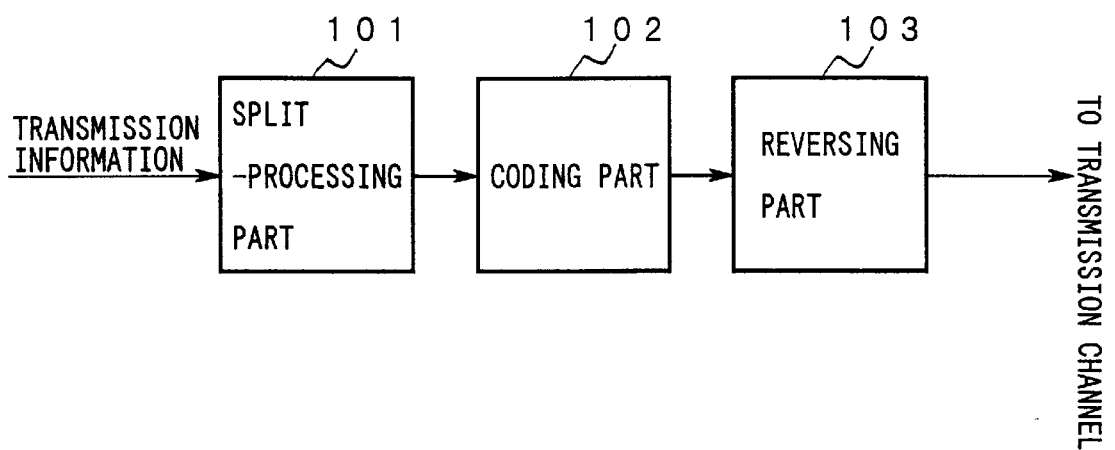
FIG. 7 shows a third embodiment of the invention.
Figure 12:
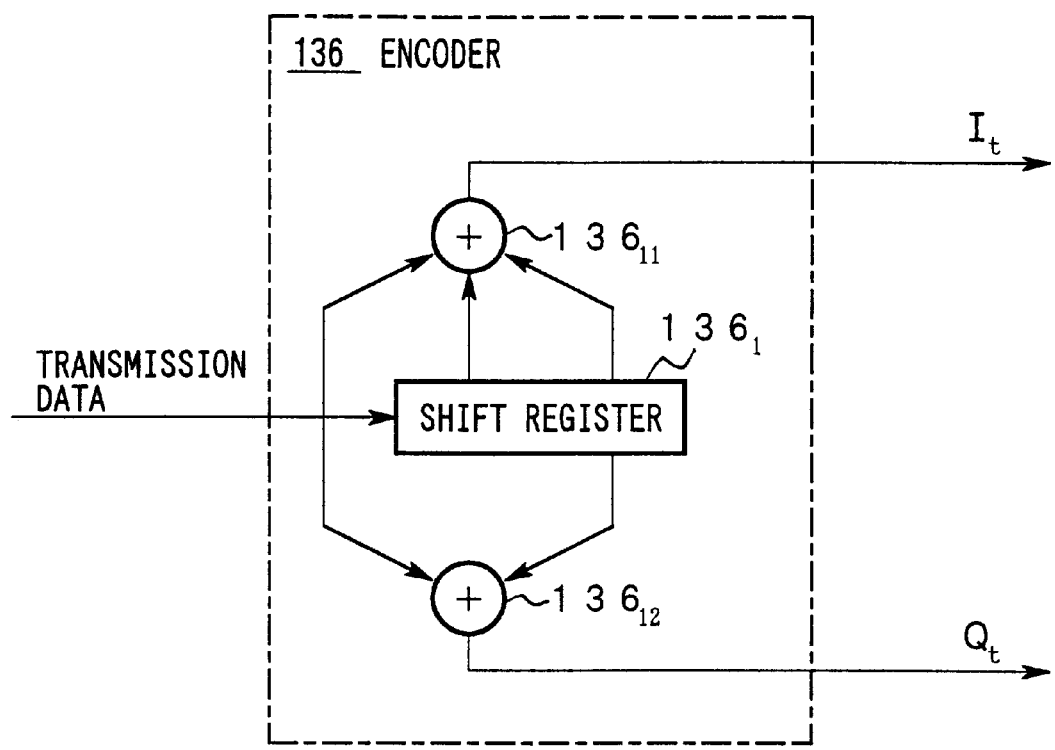
FIG. 12 shows the configuration of an encoder.

FIG. 7 shows a third embodiment of the invention.

As shown in FIG. 7, transmission information is supplied serially to the input of a split-processing part 101 and the output of the split-processing part 101 is connected to the input of a reversing part 103 via a coding part 102. The output of the reversing part 103 is connected to a transmission channel that is formed between a transmitting equipment according to this embodiment and a receiving equipment using the above-mentioned Viterbi decoder according to the first or second embodiment.

The operation of the third embodiment will be described below.

The split-processing part 101 generates an array of information blocks by splitting transmission information that is supplied serially in the above-described manner into pieces having a prescribed word length and adding TA bits (for the sake of simplicity, it is assumed here that all of these bits have a logical value "0") having a word length that conforms to decoding according to a Viterbi algorithm.

The coding part 102 converts each information block of the array of information blocks into an array of convolutional codes that can be decoded according to the above-mentioned Viterbi algorithm.

The reversing part 103 performs distribution processing (conventional interleaving) on the array of convolutional codes and performs processing of reversing the order of output data.

For example, in the reversing part 103, read addresses are output in order of "23", "17", "11", "5", ..., "12", "6", "0" that is reverse to the order of read addresses in the conventional example (see FIG. 9(*a*)) and reverse information blocks are generated, which are transmitted to the transmission channel.

Alternatively, in the second embodiment, the reversing part 103 generates reverse information blocks by performing, on an array of convolutional codes (mentioned above), processing of reversing, on a block-by-block basis, the order of time-series of a bit string that is given as the convolutional codes without performing interleaving, and transmits the generated reverse information blocks to the transmission channel.

That is, in this embodiment, reverse processing of setting, prior to a transmission, the order of reading to be performed by the de-interleaving part 71 to reverse order in accordance with read addresses that are supplied from the counter 74 is performed in a receiving equipment (for example, provided with the receiving system according to the embodiment of FIG. 3 or 6) that is placed on the other side of the transmission channel.

Therefore, in this embodiment, a receiving equipment that is placed on the other side of the transmission channel is provided with the de-interleaving part 111 shown in FIG. 8 instead of the de-interleaving part 71 shown in FIG. 3 or 6 and efficient decoding is attained there.

On the other hand, in this embodiment, since the pre-processing means 41 that should be provided at the receiving end in FIG. 1 is provided at the transmitting end, whereby the hardware size of the receiving end can be reduced.

Where a receiving end is a portable terminal equipment, the configuration according to the third embodiment is very useful in reducing the price and the size and increasing the reliability of the terminal equipment.

In each of the above embodiments, the invention is applied to a transmission system that uses a convolutional code in which the rate R of the code is ½ and the constraint length K is 3. However, as long as a trellis diagram is given for each code block as known information and decoding according to a Viterbi algorithm is possible, the invention can be applied to a convolutional code that is generated with any combination of a rate R of the code and a constraint length K. For example, the invention can similarly be applied to a transmission system that uses any of tree codes such as a trellis code in which the length k of an information block varies with time point t; and a time-varying trellis code in which code blocks are generated as a function of time point t.

Further, in each of the above embodiments, the invention is applied to a terminal equipment that is applied to a mobile communication system of the wide-band CDMA system or the PDC system. However, the invention can be applied not only to such mobile communication systems and radio transmission systems but also to any transmission systems such as line transmission systems as long as a code that can be decoded according to a Viterbi algorithm is used.

The invention is not limited to the above embodiments and a variety of embodiments are possible without departing from the spirit and scope of the invention. Any improvements may be made in part or all of the constituent parts.

What is claimed is:

1. A Viterbi decoder using a reverse trellis diagram comprising:

a branch metric computing means supplied with individual code blocks that are generated by tree-coding transmission information as code words, said code words each having reversed orders of time-series of a bit string included in the code block for computing branch metrics corresponding to all branches that are formed from a time point tj, where an encoder used in tree-coding is in a state Sj, to a time point ti that precedes said time point tj, where the ti encoder is in a state Si, said computing of branch-metrics being done in the order of time-series in which each of the code words are supplied; and an ACS-operation means for performing an ACS operation on the branch metrics computed by said branch metric computing means, calculating path metrics of paths from a final state that the encoder is to be in for each of the code blocks to the preceding state and thereby restoring said transmission information as an array of survivors.

2. A Viterbi decoder according to claim 1, further comprising storage means for storing in advance, in an order reverse the order of time series, states that said encoder can be in, in an order of time-series, during a process of tree-coding said transmission information wherein the branch metric computing means computes said branch metrics for branches that are respectively adapted to the states stored in said storage means in said order reverse the order of time-series.

3. A Viterbi decoder according to claim 2, further comprising pre-processing means for generating said code words by performing reverse processing on code blocks that are supplied as a received sequence, to reverse the order of a bit string included in each of said code blocks in an order of time-series, and for supplying said code words to said branch metric computing means.

4. A Viterbi decoder according to claim 3, wherein said pre-processing means further performs, on said code blocks supplied as said received sequence, de-interleave processing that conforms to interleave processing that was performed at the transmitting end that incorporates said encoder, together with said reverse processing.

5. A Viterbi decoder according to claim 1, further comprising local coding means for simulating, in an order reverse the order of time-series, states that the encoder can be in, in an order of time-series during the process of tree-coding, wherein the branch metric computing means computes said branch metrics for branches that are respectively adapted to the states simulated by said local coding means.

6. A Viterbi decoder according to claim 5, further comprising pre-processing means for generating said code words by performing reverse processing on code blocks that are supplied as a received sequence, to reverse the order of a bit string included in each of said code blocks in an order of time-series, and for supplying said code words to said branch metric computing means.

7. A Viterbi decoder according to claim 6, wherein said pre-processing means further performs, on said code blocks supplied as said received sequence, de-interleave processing that conforms to interleave processing that was performed at the transmitting end that incorporates said encoder, together with said reverse processing.

8. A Viterbi decoder according to claim 1, further comprising pre-processing-means for generating said code words by performing reverse processing on code blocks that are supplied as a received sequence, to reverse the order of a bit string included in each of said code blocks in an order of time-series, and for supplying said code words to said branch metric computing means.

9. A Viterbi decoder according to claim 8, wherein said pre-processing means further performs, on said code blocks supplied as said received sequence, de-interleave processing that conforms to interleave processing that was performed at the transmitting end that incorporates said encoder, together with said reverse processing.

* * * * *